United States Patent [19]

Owen

[11] Patent Number: 5,614,114

[45] Date of Patent: Mar. 25, 1997

[54] LASER SYSTEM AND METHOD FOR PLATING VIAS

[75] Inventor: Mark D. Owen, Beaverton, Oreg.

[73] Assignee: Electro Scientific Industries, Inc., Portland, Oreg.

[21] Appl. No.: 327,484

[22] Filed: Oct. 20, 1994

Related U.S. Application Data

[63] Continuation-in-part of Ser. No. 276,797, Jul. 18, 1994.

[51] Int. Cl.⁶ .................................................. B23K 26/00
[52] U.S. Cl. ............................. 219/121.66; 219/121.71; 219/121.85; 427/555; 427/597; 427/97
[58] Field of Search ....................... 219/121.66, 121.69, 219/121.71, 121.85, 121.61; 427/555, 556, 597, 596, 97; 174/266; 264/400

[56] References Cited

U.S. PATENT DOCUMENTS

| | | |
|---|---|---|
| 3,562,009 | 2/1971 | Cranston et al. . |
| 3,632,398 | 1/1972 | Konig . |
| 4,059,707 | 11/1977 | Smith et al. ............................. 427/555 |
| 4,628,174 | 12/1986 | Anthony ............................... 219/76.13 |
| 4,659,587 | 4/1987 | Imura et al. ........................... 427/554 |

(List continued on next page.)

FOREIGN PATENT DOCUMENTS

| | | |
|---|---|---|
| 0580408 | 1/1994 | European Pat. Off. . |
| 3619342 | 12/1987 | Germany . |
| 63-025913 | 2/1988 | Japan . |

OTHER PUBLICATIONS

Pete Singer, "The Interconnect Challenge: Filling Small, High Aspects Ratio Contact Holes," *Semiconductor International*, Aug. 1994, pp. 57–64.

"Printed Circuit Operations—A View from Inside," Unisys.

Hans–Ulrich Krebs et al., "Pulsed laser deposition of thin metallic alloys," *Appl. Phys. Lett.*, vol. 62, No. 19 (May 10, 1993), pp. 2341–2343.

Richard Harris et al., "MCM Micromachining: Nd:YAG UV Laser Process is a New Option," Electro Scientific Industries, Inc., Spring 1993.

"LaserPulse," Electro Scientific Industries, Inc., Fall 1993, pp. 1–7.

Y.S. Liu, "Laser Metal Deposition for High–Density Interconnect," *Optics & Photonics News*, Jun. 1992, pp. 10–14.

Friedrich G. Bachmann, "Large scale industrial application for excimer–lasers; via–hole–drilling by photo–ablation," *SPIE*, vol. 1361, Physical Concepts of Materials for Novel Optoelectronic Device Applications, 1990, pp. 500–511.

Vern Solberg, "PCMCIA Design Strategy: Adapting High Density SMT To Thin and Ultra–Thin Multilayer PC Boards," pp. 113–120.

"Dopant–Induced Excimer Laser Ablation of Poly(tetrafluoroethylene)," Applied Physics B: Photo–Physics and Laser Chemistry, Mar. 1992, vol. b54, No. 3, C R Davis et al, pp. 227–230.

"Etch–Stop Polymer Machining with an Argon Ion Laser," IBM Technical Disclosure Bulletin, Jan. 1993, vol. 36., No. 1, Armonk, NY, US, p. 254.

"Laser–Induced Plated Through–Holes," IBM Technical, Disclosure Bulletin, Oct. 1968, vol. 11, No. 5, H.R. Potts and C.A. Speicher, p. 540.

*Primary Examiner*—Philip H. Leung
*Assistant Examiner*—Gregory L. Mills
*Attorney, Agent, or Firm*—Stoel Rives LLP

[57] ABSTRACT

The output of a continuously pumped, Q-switched, Nd:YAG laser (10) is frequency converted to provide ultraviolet light (62) for plating internal wall surfaces (79, 126) of vias (72, 74) in multilayered electronic devices (80). The parameters of the output pulses (62) are selected to facilitate substantially uniform deposition of plating material particles explosively vaporized from a substrate (124) onto the internal wall surface (79, 126). These parameters typically include at least two of the following criteria: high average power of greater than about 100 milliwatts measured over the beam spot area, a temporal pulse width shorter than about 100 nanoseconds, a spot diameter of less than about 50 microns, and a repetition rate of greater than about one kilohertz.

33 Claims, 2 Drawing Sheets

U.S. PATENT DOCUMENTS

| | | | |
|---|---|---|---|
| 4,832,788 | 5/1989 | Nemiroff. | |
| 4,915,981 | 4/1990 | Traskos et al. . | |
| 5,034,569 | 7/1991 | Gofuku et al. | 219/121.66 |
| 5,060,595 | 10/1991 | Ziv et al. | 118/722 |
| 5,063,280 | 11/1991 | Inagawa et al. | 219/121.7 |
| 5,073,518 | 12/1991 | Doan et al. | 437/180 |
| 5,073,687 | 12/1991 | Inagawa et al. | 219/121.7 |
| 5,087,396 | 2/1992 | Zablotny et al. . | |
| 5,093,279 | 3/1992 | Andreshak et al. | 437/173 |
| 5,108,785 | 4/1992 | Lincoln et al. | 427/96 |
| 5,124,780 | 6/1992 | Sandhu et al. | 357/67 |
| 5,153,408 | 10/1992 | Handford et al. | 219/121.64 |
| 5,194,713 | 3/1993 | Egitto et al. | 219/121.71 |
| 5,340,947 | 9/1994 | Credle et al. | 174/262 |
| 5,378,869 | 1/1995 | Marrs et al. | 219/121.71 |
| 5,492,861 | 2/1996 | Opower | 427/597 |

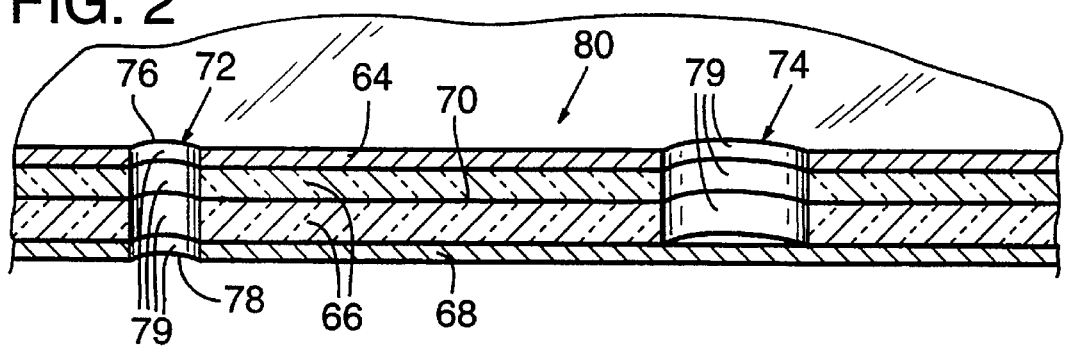
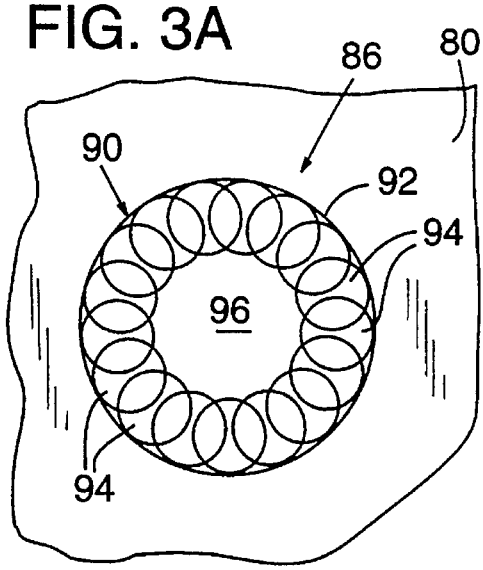
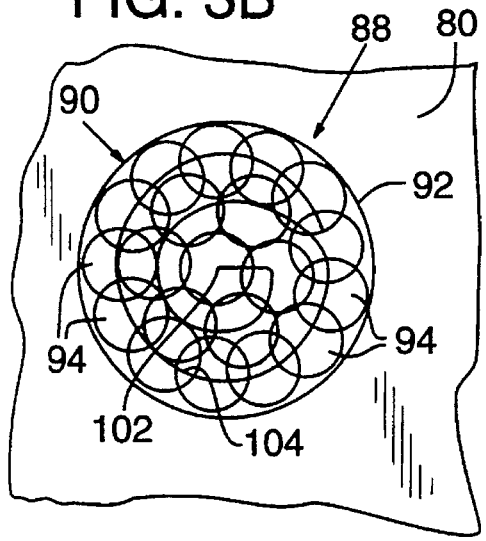
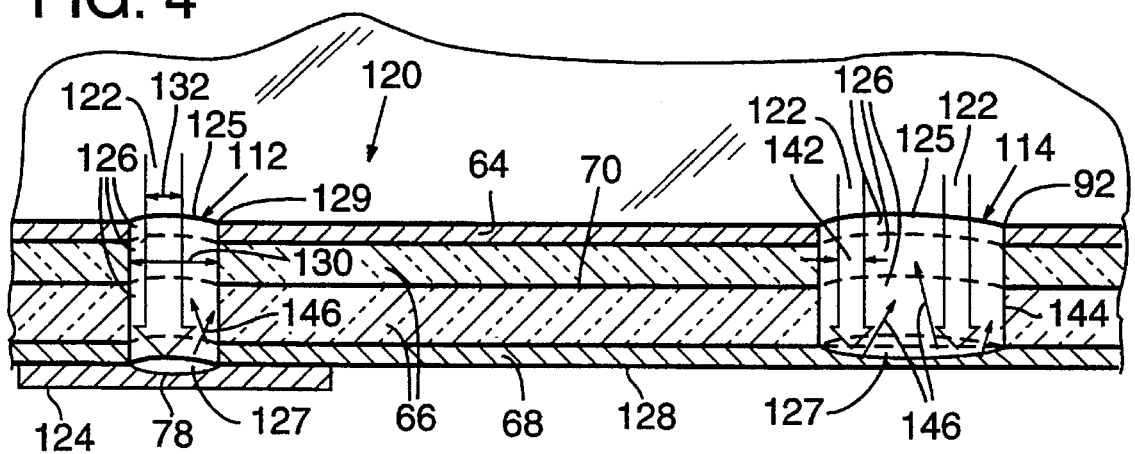

LASER SYSTEM AND METHOD FOR PLATING VIAS

This is a continuation-in-part of U.S. patent application Ser. No. 08/276,797, filed Jul. 18, 1994.

TECHNICAL FIELD

The invention relates to via plating and, in particular, to a method and an apparatus employing a laser to ablate metal from a substrate and explosively deposit the metal on an internal wall surface of a via to form a conductive interconnection.

BACKGROUND OF THE INVENTION

The background is presented herein only by way of example to multichip modules (MCMs), which are multi-material, multilayered devices that are becoming one of the electronics packaging industry's most preferred components for a variety of aerospace, computer, military, and telecommunications applications. MCMs are replacing or reducing the complexity of printed circuit boards, thus enhancing product efficiency and reliability.

MCMs and other multimaterial, multilayered electronic devices for packaging single chips such as ball grid arrays (BGA), pin grid arrays (PGA), etc; circuit boards; and hybrid and semiconductor microcircuits typically include separate component layers of metal and an organic dielectric and/or reinforcement materials. The standard metal component layer(s) may contain aluminum, copper, gold, molybdenum, nickel, palladium, platinum, silver, titanium, or tungsten, or combinations thereof. These layers typically have a depth or thickness of about 9 to 36 µm (where $7.8 \times 10^{-3}$ kg of metal equals a thickness of about 9 µm), but may be thinner or as large as 72 µm. A standard organic dielectric layer may include bismaleimide triazine (BT), cardboard, cyanate esters, epoxies, phenolics, polyimides, or polytetrafluorethylene (PTFE). These layers typically have a depth of about 50 to 400 µm. A standard reinforcement component "layer" may include fiber matts or dispersed particles of aramid fibers, ceramics, glass, or Kevlar™ woven or dispersed into the organic dielectric layer to reinforce it. These reinforcements typically have a diameter or thickness of about 1 to 10 µm. Stacks having several layers of metal, dielectric, and reinforcement material may be larger than 2 mm.

MCMs present, however, new manufacturing obstacles because they require finer lines and smaller high aspect ratio interconnections or vias and use a variety of new materials. The term "vias" is used herein generally to refer to complete through-holes or incomplete holes called "blind vias." A high aspect ratio implies a depth-to-width comparison that is typically from about one to five. After the vias are formed, they are typically plated with a metal to form interconnections between metal circuits in the multilayered electronic devices. The ability to increase the packaging density of MCM-L, MCM-L/D, PCMCIA, and laminate BGA devices to fulfill present and future technology requirements is now limited by existing processes for forming interconnections between layers. More detail concerning the industry trend and its obstacles may be found in "The Interconnect Challenge: Filling Small, High Aspect Ratio Contact Holes," *Semiconductor International*, Vol. 17, No. 9, Aug. 1994, at 57–64.

The laminate circuit board industry has explored a variety of multistep processes for forming interconnections. The most common interconnection formation process includes via formation, precleaning, surface activation, preplating, plating, and homogenization or planarization. Via formation is generally achieved by mechanical drilling or punching, but has also been accomplished to a limited extent by excimer and $CO_2$ laser ablation. The precleaning or desmearing process typically entails a chemical process employing an acid or permanganate solution.

The surface activation process generally entails seeding the internal wall surfaces with palladium to form a preliminary conductive layer or a metal adhesive layer. The palladium can be directly deposited as ions from an alkaline solution or in the form of an organometallic coating, the organics of which are subsequently chemically removed. These processes seem to work in the range of about 150 to 250 µm. Other techniques, such as carbonizing the internal wall surfaces of the via to make them sufficiently conductive for certain preplating processes, are sometimes employed.

Electroless chemical plating is the most common method for preplating the internal wall surfaces of vias. Electroless chemical plating employs a liquid solution of electroless copper to chemically react with and deposit on the internal wall surface of the via a few nanometers thickness of metal. This type of copper plating reduces the resistance across the outer layers of the multilayered electronic device to about 10 ohms (for thousands of vias). The chemical reaction generates a gas byproduct (hydrogen and oxygen) having a volume that is approximately six times the volume of a via. The electronic device is typically agitated in solution to exchange gas and reactant inside the via. At via diameters smaller than about 250 µm, the gas and reactant exchange becomes economically impractical and generally infeasible, resulting in poor coverage of the via internal wall surface.

A typical electroless copper process line includes approximately 30 tanks, each containing over 100 gallons of chemical solutions, that are sequentially connected together by a conveyor handling system. The process includes precleaning, surface activation, and electroless copper deposition steps. The entire process line is typically 60–100 feet long, and the equipment costs approximately $250,000. The various chemical solutions may cost up to about $300/gallon.

Electrochemical plating is the industry-preferred method for plating vias. The electrochemical plating process places a charge across the outer layers of the via while the electronic device is submersed in a plating bath of a copper solution. The copper ions are galvanically attracted to and cling to the via internal wall surfaces. This process is limited by its speed and the access that the electrolyte solution has to the internal wall surfaces. Thus, the vias are not totally filled. A variety of other methods for creating electrical interconnects adopted from the hybrid circuit and semiconductor industries, some of which are described below, have also been used for preplating and then followed by electrochemical plating.

Plating has also been accomplished by application of a variety of organometallic solid- or liquid-phase compositions. The compositions, such as conductive pastes, are either squeezed into the vias or the vias are submersed in the baths of the compositions. The organics are then chemically or thermally removed or displaced with more or other metals. This process generally creates porous interconnections.

Physical vapor deposition (PVD), a process primarily used for creating thin layers on horizontal surfaces, has also been adapted for plating vias. A PVD process converts the plating material into the vapor phase, transports the vapor across a region of reduced pressure, and condenses the material onto the horizontal surface to form a thin film. The two common types of PVD, evaporative PVD and sputtering, employ the addition of heat or the physical dislodgement of surface atoms by momentum transfer, respectively, to convert the material to the vapor phase. The processes necessitate a protective mask to safeguard the top surface of the device prior to via plating or an etching step to remove undesirable metal after via plating. These processes also cause the formation of "keyhole voids." These voids occur because vias typically have aspect ratios greater than one, so the top via rim accumulates metal and becomes sealed before the entire via volume is filled. In some cases, especially whenever the aspect ratio is high, the vias may inadvertently be sealed prior to the sufficient coating of the entire internal wall surfaces.

The chemical vapor deposition (CVD) process, on the other hand, reacts chemical vapors of desired concentrations with the heated surface of the device to form a thin film. Like the other vapor deposition processes, CVD necessitates device surface protection when the process is utilized as a via plating technique.

Postplating homogenation or planarization are typically employed to diffuse metals into porously filled vias or to reduce the voids or diminish the lips formed at via rims. These processes are generally thermal.

Some researchers, particularly in the semiconductor industry, have investigated using laser technology to assist in some of the steps for forming a conductive interconnect. For example, lasers have been used to modify the surface in preparation for a metallization step, a process similar to that employed in copy machine technology. The surface is charred with, for example, a $CO_2$ laser and then exposed to some standard thin film technique that preferentially responds to the laser-activated sites. Lasers have also been used to enhance chemical vapor deposition where the laser acts to heat the via site and prepare the area for the chemical diffusion of the metals in the vapor (pyrolytic decomposition). This method is described in U.S. Pat. No. 5,060,595 of Ziv et al., but this method works only with certain Si and Si oxide combinations that exhibit high absorption at 532 nm (frequency-doubled YAG).

A variety of laser metal deposition techniques has also been explored for use in direct imaging of circuits as described by Liu in "Laser Metal Deposition for High-Density Interconnect," *Optics & Photonics News*, June 1992, at 10–14. Such laser-activated chemical deposition processes are generally characterized as either photolytic or pyrolitic. These processes are typically followed by chemical electroplating techniques.

Laser photolytic processes employ laser light to directly cause chemical changes in organo-metallic solutions such that the metals dissociate from the organics and cling to the internal wall surfaces of the vias. These photolytic processes generally result, however, in plating speeds that are too slow for commercial use.

Laser pyrolytic processes employ heat from a laser source to break apart organo-metallic molecules applied as thin films to electronic devices. The heat releases the organic molecules and leaves the metals. A variety of metals have been deposited in this manner.

Another method uses an XeCl excimer laser at 308 nm to planarize a top aluminum layer causing melted aluminum to flow into vias creating interconnections as described by Bachmann in "Physical Concepts of Materials for Novel Optoelectronic Device Applications," *SPIE*, Vol. 1361, 1990, at 500–11.

Excimer lasers have also been employed to enhance PVD sputtering processes at very low power and repetition rates to produce thin films of several materials. Further details concerning this technique can be found in "Pulsed Laser Deposition of Thin Metallic Alloys," Appl. Phys. Lett., Vol. 62, No. 19, May 10, 1993, by Krebs and Bremert.

Skilled persons will appreciate that the cleaning, preplating, and planarizing techniques described above are all relatively slow batch processes, requiring expensive baths, masks, or postprocessing. In addition to being expensive and largely inefficient, most of the plating techniques require both a cleansing as well as a preplating process. The industry needs, therefore, faster and more efficient via plating and/or preplating processes that minimize the tooling as well as the steps for plating vias comprising a wide variety of sizes and internal wall materials.

SUMMARY OF THE INVENTION

An object of the present invention is, therefore, to provide a laser system and method for preplating and/or plating internal wall surfaces of multilayered electronic devices.

The present invention employs a primarily thermal and physical process rather than the conventional chemical, electrolytic, photolytic, or pyrolytic processes to plate the internal wall surfaces of multilayered electronic devices. Furthermore, the process does not require a highly controlled or complex environment such as a vacuum, chemical solutions, or organo-metallic vapors. In contradistinction, the invention employs laser output pulses to heat and explosively vaporize metal in proximity to the internal wall surface of a multilayered electronic device, particularly that of a via.

A preferred embodiment of the present invention quadruples the frequency of the output of a continuously pumped, Q-switched, Nd:YAG laser to generate ultraviolet light output pulses at a high repetition rate. The laser pulses irradiate a metallic plating material, such as copper, from a target substrate located beneath an unplated via. The short duration ultraviolet laser pulses are highly absorbed by the metal and cause a rapid, explosive vaporization that causes micron and submicron metallic vaporization particles to splatter against the internal wall surface of the via. The particles impact the softer dielectric material along the internal wall surfaces of the vias and become physically imbedded along the wall surfaces by the heat and velocity as well as adhere to the ends of the metal layers. The process generates uniformly coated via internal wall surfaces having significant bonding strength to the dielectric material. The characteristics of the laser pulses can be adjusted to select the thickness of the metal coating. The process, therefore, allows high aspect ratio vias to be pre-plated and/or plated using virtually any metal on virtually any dielectric.

Similarly, blind vias can be plated by using part of the metal layer at the bottom of the blind via sacrificially to provide the material for coating the internal wall surface of the blind via.

Additional objects and advantages of the present invention will be apparent from the following detailed description of a preferred embodiment thereof, which proceeds with reference to the accompanying drawings.

BRIEF DESCRIPTION OF THE DRAWINGS

FIG. 2 is an enlarged sectional side elevation view of a multilayered target having a through-hole and a blind via.

FIGS. 3A and 3B show cutting profiles for forming a through-hole and a blind via, respectively.

FIG. 4 is an enlarged sectional side elevation view depicting the plating process of the present invention applied to a small diameter through-hole via and a large diameter blind via in a multilayered target.

DETAILED DESCRIPTION OF A PREFERRED EMBODIMENT

Figure 1:
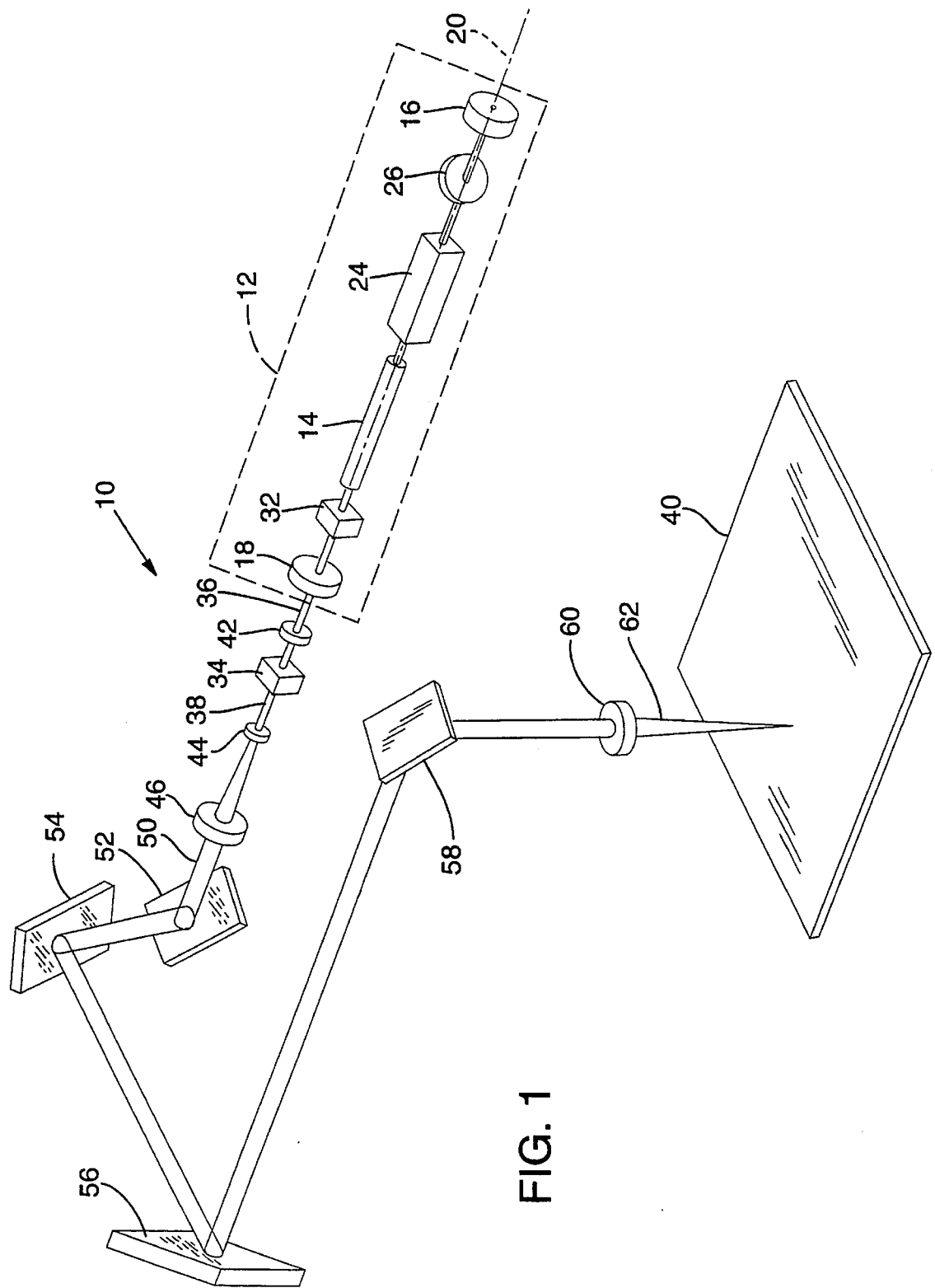
FIG. 1 is an isometric view of the components of a simplified laser system employed for generating desirable laser pulses in accordance with the present invention.

With reference to FIG. 1, a preferred embodiment of a laser system 10 of the present invention includes a resonator 12 defined by a laser rod 14 positioned between a rear mirror 16 and an output mirror 18 along an optic axis 20. Mirror 16 is preferably 100 percent reflective, and mirror 18 is partly transmissive to light propagating along optic axis 20. Laser rod 14 preferably includes a solid-state lasant such as Nd:YAG, Nd:YLF, Nd:YAP, or Nd:YVO$_4$, or a YAG crystal doped with holmium or erbium. Laser rod 14 may be pumped by a variety of pumping sources (not shown) well known to persons skilled in the art, but a krypton arc lamp is or a suitable diode laser would be preferred for laser system 10 of the present invention.

Q-switches and their uses, positioning, and operation are also well known to persons skilled in the art. In laser system 10, a Q-switch 24 is preferably positioned within resonator 12 along optic axis 20 between laser rod 14 and mirror 16.

The output of laser rod 14 is converted to a preferred ultraviolet wavelength through two stages of harmonic generation or frequency doubling. Second harmonic generation may be produced by a first frequency converter 32 such as a nonlinear crystal inserted along optic axis 20 and angle-tuned for optimum phase matching with the output of laser rod 14. Skilled persons will appreciate that there are numerous other techniques conventionally employed for phase matching. The amount of energy converted to the second harmonic is a function of a number of laser characteristics including peak power, mode structure, and beam divergence of the fundamental wavelength. Pertinent factors for selecting a particular nonlinear crystal include nonlinear coefficients, angular acceptance, and damage threshold.

In a preferred laser system 10 that is a continuously pumped, Q-switched, Nd:YAG laser, frequency doubling is efficiently accomplished with a barium borate crystal 32 positioned within resonator 12 along optic axis 20, as shown in FIG. 1. Skilled persons will appreciate that numerous other frequency converting crystals might be used, such as lithium borate.

The doubling process is enhanced by a Brewster plate polarizer 26 preferably positioned between rear mirror 16 and laser rod 14. In addition, output mirror 18 is selected to be highly reflective to the fundamental wavelength generated by laser rod 14 (1064 nm for a Nd:YAG) to increase the intracavity peak power, thereby increasing the harmonic conversion (to 532 nm) efficiency by as much as 80 percent.

A second frequency converter 34 (also preferably barium borate) is positioned along optic axis 20 external to resonator 12 to produce the fourth harmonic output 38 (266 nm) of the fundamental wavelength, i.e., the second harmonic of resonator output 36, with a conversion efficiency of approximately 25 percent. The resonator output 36 may be separated into the two wavelengths (532 nm and 266 nm) with one or more beamsplitters (not shown). The fourth harmonic output 38 at 266 nm may also be varied by rotating the input polarization of the 532 nm resonator output 36 with a polarization state changer 42 positioned along optic axis 20. Polarization state changer 42 may be a quarter-wave plate or a variable polarization state changer under operative control of a central processing unit (not shown) such as described in U.S. patent application Ser. No. 08/064,515, filed May 18, 1993, assigned to the assignee of this application, and herein incorporated by reference.

The fourth harmonic output 38 may be manipulated by a variety of well-known optics including beam expander lens components 44 and 46 that are positioned along beam path 50 before a series of beam-directing reflectors 52, 54, 56, and 58. Finally, the fourth harmonic output 38 is passed through a focusing lens 60 before being applied as processing output beam 62 to target 40. Other preferred wavelengths of processing output beam 62 include 213 nm (frequently quintupled) and 355 nm (frequency tripled). Skilled persons will appreciate that frequency converter 34 would be preferably positioned within resonator 12 if frequency tripling is desired.

FIG. 2 is a cross-sectional side view of an enlarged portion of a generic multilayered electronic device 80 that may, for example, be an MCM, capacitor, resistor, or hybrid or semiconductor microcircuit. For convenience, device 80 is depicted as having only four layers: 64, 66, 68, and 70.

Layers 64 and 68 may contain, for example, standard metals such as aluminum, copper, gold, molybdenum, nickel, palladium, platinum, silver, titanium, tungsten, metal nitrides, or combinations thereof. Conventional metal layers vary in thickness, typically between 9 and 36 µm, but may be thinner or as thick as 72 µm. Layer 66 may, for example, contain a standard organic dielectric material such as BT, benzocyclobutane (BCB), cardboard, cyanate esters, epoxies, phenolics, polyimides, PTFE, various polymer alloys, or combinations thereof. Conventional organic dielectric layers 66 vary considerably in thickness, but are typically much thicker than metal layers 64 and 68. An exemplary thickness range for organic dielectric layers 66 is about 50 to 200 μm, but they may be placed in stacks as large as 2 mm. A standard reinforcement component or "layer 70" may be fiber matte or dispersed particles of, for example, aramid fibers, ceramics, glass, or Kevlar™ woven or dispersed into organic dielectric layer 66. Conventional reinforcement layers 70 are typically much thinner than organic dielectric layers 66 and may be on the order of 1 to 2 μm and perhaps up to 10 μm. Skilled persons will appreciate that reinforcement material may be introduced as powders into the organic dielectrics. The "layers 70" formed by such powdery reinforcement material may be noncontiguous and nonuniform. Skilled persons will also appreciate that layers 64, 66, and 68 may also be internally noncontiguous, nonuniform, and nonlevel.

FIG. 2 also depicts a through-hole via 72 and a blind via 74 formed in multilayered electronic device 80. Vias 72 and 74 are conventionally created by mechanical drills but may be produced with varying quality and efficiency by certain laser techniques.

In a preferred embodiment, through-hole 72 cleanly and evenly penetrates all layers and materials of target 40 and exhibits negligible taper from its top 76 to its bottom 78 along its internal wall surface 79. Blind via 74 does not penetrate all layers and/or materials. In FIG. 2, blind via 74 stops at and does not penetrate layer 68. Thus, proper selection of the parameters of processing output beam 62 of laser system 10 permits layer 68 to remain unaffected even if it comprises the same metal component(s) as layer 64.

The parameters of processing output beam 62 can be selected to facilitate substantially clean, sequential or simultaneous drilling, i.e., via formation, of a wide variety of multimaterial targets. Such targets may comprise, for example, organic dielectrics, reinforcement materials, and/ or metals that exhibit different optical absorption and other characteristics in response to ultraviolet light, i.e., wavelengths shorter than about 400 nm. The preferred parameters of processing output beam 62 for forming vias are selected in an attempt to circumvent at least some of the thermal damage effects by utilizing temporal pulse widths that are shorter than about 100 ns, preferably from about 40 to 90 ns or shorter. Other preferred parameters include average powers greater than about 100 mW measured over the beam spot area; spot size diameters or spatial major axes of less than about 50 μm, preferably from about 10 to 50 μm; a repetition rate of greater than about 200 Hz, preferably greater than about 1 kHz or even 5 kHz; and an ultraviolet wavelength, preferably between about 193 to 355 nm. Skilled persons will also appreciate that the spot area of output beam 62 is generally circular, but may be very slightly elliptical.

Via diameters preferably range from 25 to 300 μm, but laser system 10 may produce vias 72 and 74 that are as small as about 5 to 25 μm or much greater than 1 mm. Because the preferred spot size of output beam 62 is about 25 μm in diameter, vias larger than 25 μm may be produced by trepanning, concentric circle processing, or spiral processing. FIGS. 3A and 3B show cutting profiles for forming a through-hole 86 and a blind via 88, respectively, that are larger than the spot size of output beam 62.

With reference to FIG. 3A, through-hole 86 defines on the surface of electronic device 80 a circular spatial region 90 having a periphery 92. Output beam 62 has a spot area 94 that is less than the area of region 90. Through-hole 86 is formed by sequentially positioning beam 62 having spot area 94 at overlapping contiguous locations around periphery 92. Beam 62 is preferably pulsed while moving continuously around periphery 92 such that the pulse overlap (bite size) and number of revolutions or passes are combined to deliver the number of beam pulses at each location necessary to achieve the desired depth of cut. After beam 62 completes a sufficient number of passes about the path around periphery 92, the center target material 96 falls out to form through-hole 86. This process is called "trepanning."

With reference to FIG. 3B, blind via 88 also defines on the surface of target 40 a circular region 90 having a periphery 92. Output beam 62 having spot area 92 is initially positioned at the center 102 of region 90. Blind via 88 is formed by sequentially positioning beam 62 having spot area 94 at overlapping contiguous locations along a spiral path 104 to periphery 92. Beam 62 is moved continuously or kept at each location for sufficient time for system 10 to deliver the number of beam pulses necessary to achieve the depth of cut at the location. As beam 62 proceeds along spiral path 104, the target material is "nibbled" away to form a hole of increasing size each time beam 62 is moved to a new cutting location. The final shape of the hole is achieved when beam 62 moves along a circular path at periphery 92. Skilled persons will appreciate that either device 80 or processing output beam 62 may be fixed or moved relative to the position of the other.

Several examples of through-hole vias and blind vias of various depths and diameters produced on a number of different substrates are set forth below. These vias were all produced with a Model 4575 UV laser (generally at 266 nm) in a Model 4420 laser system manufactured by Electro Scientific Industries, Inc. in Portland, Oreg., the assignee of the present application.

EXAMPLE 1

With reference to Table 1, through-holes (samples 1 to 5) and blind vias (samples 6 to 9) were produced on 190.5 μm thick, three-layered copper/FR4 (a level 4 fire-retardant epoxy-glass composition)/copper targets. These experiments were conducted with a 25 mm lens. Through-holes and blind vias having a diameter larger than 51 μm were produced by concentric circles with a 10 mm pitch. The average power was set at 260 mW, measured at 2 kHz.

TABLE 1

TEST RESULTS ON COPPER/FR4/COPPER

| Sample # | Via Diameter (μM) | Speed (mm/s) | Bite Size (μm) | Rep Rate (kHz) | # Passes | Taper (μm) | Throughput (holes/sec) |
|---|---|---|---|---|---|---|---|
| VIA DRILLING | | | | | | | |
| 1<br>10 × 10 array | 25 | 0.4 | 0.2 | 2 | 2 | 5 | 2.3 |
| 2<br>10 × 10 array | 51 | 4.0 | 2.0 | 2 | 6 | 12 | 3.9 |
| 3<br>10 × 10 array | 102 | 7.0 | 3.0 | 2.3 | 12 | 9 | 1.9 |
| 4<br>10 × 10 array | 152 | 7.0 | 7.0 | 2.3 | 13 | 10 | 1.1 |
| 5<br>10 × 10 array | 203 | 7.0 | 7.0 | 2.3 | 14 | 12 | 0.79 |
| BLIND VIAS DRILLING | | | | | | | |
| 6<br>3 × 3 array | 51 | 3.0 | 3.0 | 1 | 2 | — | 6.9 |
| 7<br>3 × 3 array | 102 | 2.0 | 0.75 | 2.7 | 1 | — | 1.4 |
| 8<br>3 × 3 array | 152 | 3.0 | 3.0 | 1 | 2 | — | 0.36 |
| 9<br>3 × 3 array | 203 | 3.0 | 3.0 | 1 | 2 | — | 0.21 |

EXAMPLE 2

With reference to Table 2, blind vias were produced on two samples of 1.6 mm thick, three-layered copper/epoxy-glass prepeg/copper targets. These experiments were conducted with a 50 mm lens. Sample 1 had preexisting vias through one of the copper layers to test the efficacy of removing the epoxy glass prepeg material. The 203 μm diameter vias were produced by spiral cutting to remove the material in the center of the via. The average power was set at 270 mW, measured at a repetition rate of 2 kHz.

targets. These experiments were conducted with a 25 mm lens. The blind vias were cut using concentric circles with a pitch of 15 μm. The average power 300 mW, measured at a repetition rate of 2 kHz.

TABLE 2

TEST RESULTS ON COPPER/EPOXY GLASS PREPEG/COPPER

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 1 | 203 | 4.75 | 2 | 2.4 | 1 | — | 0.9 |
| 2 | 51 | 4.75 | 2 | 2.4 | 2 | — | 8.4 |

EXAMPLE 3

With reference to Table 3, through-holes (samples 1 to 5) and blind vias (samples 6 to 9) were produced on 178 μm thick, three-layered copper/liquid crystal polymer/copper

TABLE 3

TEST RESULTS ON COPPER/LIQUID CRYSTAL POLYMER/COPPER

| Sample # | Via Diameter (μM) | Speed (mm/s) | Bite Size (μm) | Rep Rate (kHz) | # Passes | Taper (μm) | Throughput (holes/sec) |
|---|---|---|---|---|---|---|---|
| VIA DRILLING | | | | | | | |
| 1 10 × 10 array | 25 | 4.5 | 1.5 | 3 | 5 | 7 | 4.5 |
| 2 10 × 10 array | 51 | 4.5 | 1.5 | 3 | 5 | 7 | 4.5 |
| 3 10 × 10 array | 76 | 7.0 | 2.0 | 3.5 | 8 | 9 | 3.1 |
| 4 10 × 10 array | 102 | 9.0 | 3.0 | 3 | 12 | 7 | 2.2 |
| 5 10 × 10 array | 127 | 12.0 | 4.0 | 3 | 14 | 6 | 1.9 |
| BLIND VIAS DRILLING | | | | | | | |
| 6 3 × 3 array | 70 | 3 | 3.0 | 1 | 2 | — | 0.70 |
| 7 3 × 3 array | 88 | 3 | 3.0 | 1 | 2 | — | 0.52 |
| 8 3 × 3 array | 121 | 3 | 3.0 | 1 | 2 | — | 0.35 |
| 9 3 × 3 array | 141 | 3 | 3.0 | 1 | 2 | — | 0.28 |

EXAMPLE 4

With reference to Table 4, through-holes were produced on two samples of 533 μm thick, two-layered 5 copper-clad, glass-reinforced polyimide targets.

resulting in an effective spot size of about 25 μm. The average power was 250 mW, measured at a repetition rate of about 2 kHz. The through-holes were trepanned.

TABLE 4

TEST RESULTS ON COPPER-CLAD, GLASS-REINFORCED POLYAMIDE

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 1 | 100 | 50 | — | 2 | 5 | 18 | 1.5+ |
| 2 | 100 | 100 | — | 2 | 6 | 18 | 1.5+ |

EXAMPLE 5

With reference to Table 5, through-holes were produced on 254 μm thick, two-layered glass fiber-reinforced cyanate ester (samples 1 to 3) and 254 μm thick, two-layered random glass powder-reinforced cyanate ester targets. These experiments were performed with a 25 mm focal length lens

TABLE 5

TEST RESULTS ON GLASS (FIBER OR POWDER) - REINFORCED CYANATE ESTER

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 1 | 50 | 5 | — | 2.5 | 4 | — | 5.4 |
| 2 | 89 | 7 | — | 3.5 | 7 | — | 3.5 |
| 3 | 100 | 8 | — | 3.2 | 7 | — | 3.5 |
| 4 | 89 | 8.1 | — | 2.7 | 2 | — | 3.5 |

EXAMPLE 6

With reference to Table 6, through-holes were produced on 100 μm thick, two-layered epoxy glass with 18 μm copper (Hi-Tg. multifunctional Norplex Oak) (sample 1) and 50 μm thick, two-layered aramid reinforced epoxy with 9.0 μm copper (samples 2 to 3) targets. These experiments were conducted with a 25 mm focal length lens resulting in an effective spot size of 25 μm. The through-holes were trepanned. The average output power was 270 mW, measured at a repetition rate of 2 kHz.

polyimide/18 μm copper (samples 6, 7, 9) targets. These experiments were performed with a 25 mm focal length lens resulting in an effective spot size of 25 μm. The through-holes were trepanned at a uniform power. The blind vias were produced by processing the organic dielectric and the metal layers at different peak powers. The average output power was 225 mW, measured at a repetition rate of 2 kHz.

TABLE 6

TEST RESULTS ON COPPER-CLAD, EPOXY GLASS OR ARAMID EPOXY

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 1 | 100 | 10 | — | 4 | 5 | 9 | 1.15 |
| 2 | 50 | 3.6 | — | 4.5 | 1 | 9 | 11.7 |
| 3 | 100 | 8.1 | — | 2.7 | 2 | 9 | 6.3 |

EXAMPLE 7

With reference to Table 7, through-holes were produced on 71 μm thick FR4/18 μm copper (samples 1, 3 to 5), and 142 μm thick (two-layer stack) FR4/18 μm copper (sample 2). These experiments were conducted with a 25 mm focal length lens resulting in an effective spot size of about 25 μm. The through-holes were trepanned. The average output power was 300 mW, measured at a repetition rate of 2 kHz.

TABLE 7

TEST RESULTS ON COPPER-CLAD FR4

| Sample # | Via Diameter (μM) | Speed (mm/s) | Bite Size (μm) | Rep Rate (kHz) | # Passes | Taper (μm) | Throughput (holes/sec) |
|---|---|---|---|---|---|---|---|
| 1 | 50 | 5 | — | 4 | 2 | 10 | 8.4 |
| 2 | 50 | 5 | — | 4 | 5 | 10 | 9.1 |
| 3 | 100 | 8 | — | 4 | 5 | 10 | 4.6 |
| 4 | 200 | 10 | — | 4 | 8 | 10 | 1.9 |
| 5 | 300 | 10 | — | 4 | 10 | 10 | 1.0 |

EXAMPLE 8

With reference to Table 8, through-hole vias and blind vias were produced on three-layered, 305 μm epoxy glass/18 μm copper (samples 1, 2, 8); three-layered, 102 μm epoxy glass/18 μm copper (samples 3 to 5); and three-layered glass

TABLE 8

TEST RESULTS ON COPPER-CLAD EPOXY GLASS, GLASS POLYIMIDE, AND POLYIMIDE

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 1 | 102 | 8 | — | 3.2 | 15 | 12 | 1.7 |
| 2 | 51 | 3.21 | — | 1.6 | 10 | 12 | 2.4 |
| 3 | 102 | 7.8 | — | 3.1 | 5 | 12 | 4.4 |
| 4 | 51 | 3.2 | — | 2.1 | 2 | 12 | 7.8 |
| 5 | 25 | N/A | — | 4 | 100 pulses | 12 | 15 |
| 6 | 102 | 7.6 | — | 1.5 | 6 | 12 | 3.8 |
| 7 | 51 | 3.2 | — | 1.6 | 4 | 12 | 5.3 |
| 8 | 102 | 8 | — | +5 | 10 | ]12 | 2 |
| 9 | 51 | 3.2 | — | +20 | 1 | 12 | 3.7 |

EXAMPLE 9

With reference to Table 9, through-hole vias were produced on five 9 μm thick layers/four 50 to 150 μm thick layers of PTFE targets having a total thickness of about 445 μm. The average output power was about 250 mW, measured at a reptition rate of 2 kHz.

TABLE 9

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 1 | 50 μm | 2 | — | 4 kHz | 5 | 11 μm | 2.0 |
| 2 | 25 μm | — | — | 4 kHz | 50 pulses | — | 8.0 |
| 3 | 125 μm | 2 | — | 2 kHz | 10 | 14 μm | 0.46 |

EXAMPLE 10

With reference to Table 10, through-hole vias and blind vias were produced on 25 μm copper/275 μm BT glass fiber laminate targets. The average output power was 250 mW, measured at a repetition rate of 2 kHz.

TABLE 10

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| VIA DRILLING | | | | | | | |
| 1 | 50 | 10 | — | 2 kHz | 4 | 10 μm | 0.8 |
| 2 | 100 | 10 | — | 2 kHz | 4 | 15 μm | 0.5 |
| BLIND VIA DRILLING | | | | | | | |
|  | 50 | 5 | — | 2 kHz | 1 | — | 2.0 |
|  | 100 | 5 | — | 2 kHz | 1 | — | 0.7 |

FIG. 4 is an enlarged sectional side elevation view depicting the plating process of the present invention applied to a small diameter through-hole via 112 and a large diameter blind via 114 in an electronic device 120. With reference to FIG. 4, a laser processing output beam 122 is generated from a laser system 10 such as that described with respect to FIG. 1. Beam 122 is directed at substrate 124 positioned in proximity to internal wall surface 126 of via 112 in electronic device 120. Substrate 124 is preferably positioned so that it is beneath via 112 such that substrate 124 contacts bottom surface 128 of layer 68 and covers bottom opening or end 78 of via 112. Beam 122 travels through top opening or end 125 of via 112 and is propagated parallel to internal wall surface 126 to strike normal to substrate 124 positioned across bottom opening 78, forming crater 127.

Substrate 124 includes a plating material that preferably comprises copper, but may comprise a variety of metals such as aluminum, copper, gold, molybdenum, nickel, palladium, platinum, silver, tin, titanium, tungsten, metal nitrides, or combinations thereof, or a variety of other materials. Skilled persons will appreciate that substrate 124 may comprise only the plating material or may comprise a variety of other materials on which the plating material has been positioned.

The relative positioning of substrate 124 and internal wall surface 126 with respect to each other and beam 122 prohibits plating material from building up around periphery 92 or 129 of top opening 125. Thus, the method of the present invention avoids the formation of key hole voids.

Furthermore, neither beam controlling masks nor protective layers need to be positioned above device 80.

For vias 112 having a diameter 130 of less than about 50 µm, a beam spot size 132 is selected to be slightly less than diameter 130, and the beam 122 is positioned concentrically within via 112. For vias 114 having a diameter 140 of greater than about 50 µm, beam spot size 142 is preferably about 25 µm, and a beam positioning profile similar to that described with respect to FIG. 3A is employed to plate the internal wall surface 126 of via 114 about its periphery 144.

The parameters of beam 122 are selected so that beam 122 is highly absorbed by the plating material on substrate 124 or metal layer 68 and causes a rapid, explosive vaporization of the plating material, generating micron and submicron vaporization particles that splatter in random directions 146 and become embedded within internal wall surface 126. The process generates well-bonded, uniformly coated via internal wall surfaces.

The proximity of the substrate 124 to via 112 and the nature of the laser vaporization provide a plating to dielectric material bonding strength that is superior to that available through most of the conventional plating techniques. The characteristics of the laser pulses can be adjusted to modify the thickness of the metal coating. The process, therefore, allows very small diameter vias to be plated using virtually any metal on virtually any dielectric material.

Skilled persons will appreciate that this plating or preplating process does not require precleaning or preseeding processes nor does this process require a carefully controlled processing environment such as a reduced pressure, stoichiometric chemical vapors, or temperature control of substrate or environment. A single ablative pass has been demonstrated to provide an adequate plating thickness of about 1 µm to eliminate the entire traditional, multistep electroless plating proces as well as the traditional seeding and cleaning processes. These laser-plated vias are immediately ready for electro-chemical plating, if desired. Skilled persons will appreciate that one or more subsequent ablative passes on the same or a replaced substrate 124 can be employed to increase the thickness of the plating applied to internal wall surface 126. Furthermore, one or more ablative passes may be modified to deposit sufficient plating material to eliminate the need for electrochemical plating as well.

The present invention permits vias to be formed and plated with a single laser system. Furthermore, if complete via filling is required, the same laser system may be employed to planarize or reflow the final amount of material into the via. Accordingly, the entire interconnection formation process may be achieved with a single system. The processes can be manipulated so that they are rapidly sequential.

The laser plating process allows a high degree of control. If greater hole conductivity is required to ease electroplating processing conditions, the number of passes, number of pulses, or the peak power per pulse can be increased. For higher aspect ratio holes (or on thicker materials), the peak power can be increased to cause greater dispersion in the vaporized metals. For plating small aspect blind vias, trepanning near the diameter of the via with low peak power would be preferable. For various laminate materials, the laser condition can be optimized to increase adhesion or reduce penetration of the metal particles. For very small holes, the laser optics could be varied down to the fundamental limits in the 1–10 µm range.

Skilled persons will appreciate that many laser systems and a wide range of beam parameters are capable of explosively transferring plating material from a substrate to an internal wall surface; however, high-power, short-duration, UV laser pulses are preferred.

Skilled persons will also appreciate that a variety of different substrates 124 may be sequentially ablated (with the same or different laser parameters) onto internal wall surface 126. For example, one or several ablative passes over a copper substrate 126 may be followed by one or several ablative passes over a tin substrate 126. Tin or other metal coatings might be applied to cover and protect a metallic plating from subsequent MCM production steps, environmental degradation, or intermetallic formations. These metal coating processes have been traditionally accomplished through electrochemical plating or CVD processes.

The method for plating blind vias 114 does not employ an external substrate 124. Beam 122 may instead be directed at the bottommost metal layer 68, part of which may be sacrificially ablated to plate blind via 114. Manufacturers of electronic devices may choose to produce thicker bottom metal layers 68 to advantageously practice this blind via plating technique.

Several examples of via plating are set forth below. The plating process was performed by a Model 4575 UV laser (generally at 266 nm) in a Model 4420 laser system manufactured by Electro Scientific Industries, Inc. in Portland, Oreg.

EXAMPLE 11

One hundred 100 µm-diameter through-holes in an electronic device comprising 18 µm thick copper-clad, 100 µm polyimide with glass fibers were plated by trepanning about the perimeter of an 80 µm-diameter, generally concentric circle on a copper substrate positioned beneath the electronic device. The trepanning was performed in five passes at about 5 mm/s at a repetition rate of 2 kHz and an average power of 250 mW. The process averaged about three holes per second. The resistance across the thickness of the electronic device was 1.75 kΩ before the plating process and was 60 Ω after plating. The resulting plating was estimated to have a thickness of about 1 µm.

EXAMPLE 12

One hundred 100 µm-diameter through-holes in an electronic device comprising 18 µm thick copper-clad, 100 µm polyimide with glass fibers were plated by trepanning about the perimeter of a 70 µm-diameter, generally concentric circle on a copper substrate positioned beneath the electronic device. The trepanning was performed in 10 passes at about 5 mm/s at a repetition rate of 2 kHz and an average power of 250 mW. The process averaged about 1.7 holes per second. The resistance across the thickness of the electronic device was 1.75 kΩ before the plating process and was 0.7

Ω after plating. The resulting plating was estimated to have a thickness of about 1 μm.

EXAMPLE 13

One hundred 250 μm-diameter through-holes in an electronic device comprising 18 μm thick copper-clad, 290 μm thick FR4 (a level 4 fire-retardant epoxy-glass composition) were plated by trepanning about the perimeter of a 200 μm-diameter, generally concentric circle on a copper substrate positioned beneath the electronic device. The trepanning was performed in 50 passes at about 15 mm/s at a repetition rate 1.5 kHz. The average power was set at 290 mW, measured at 2 kHz. The process averaged about one-half hole per second. The resistance across the thickness of the electronic device was 1.75 kΩ before the plating process and was 0.35 Ω after plating. The resulting plating was estimated to have a thickness of about 1 μm.

Skilled persons will appreciate that while downward beamstrikes on bottom-positioned plating materials are preferred, off-axis beam strikes may be employed to adjust the uniformity of the plating deposited on the internal wall surfaces. Similarly, skilled persons will appreciate that processing beam 122 may be directed through vias 112 and 114 from below to ablate a top-positioned plating material, or the process may be conducted sideways or at various orientations. Furthermore, after a first ablative pass through one opening, very high aspect ratio through-holes might be more efficiently processed by subsequently performing a second ablative pass through the opposite opening. Thus, lasers (and substrates alternately) could be positioned on either side of the device, or the device could be flipped between such alternate passes. Skilled persons will also appreciate that the method of the present invention may also be employed to plate square or other noncircular-shaped vias.

It will be obvious to those having skill in the art that various changes may be made in the details of the above-described embodiment of the present invention without departing from the underlying principles thereof. The scope of the present invention should, therefore, be determined only by the following claims.

I claim:

1. A method for plating an internal wall surface of a via through at least one layer of a device having multiple layers, comprising:

generating a laser output of at least one pulse having a spot area, a wavelength shorter than about 400 nm, a temporal pulse width shorter than about 100 ns, and an average output power of greater than about 100 mW measured over the spot area;

directing the laser output through the via toward a substrate having an electrically conductive plating material positioned in proximity to the internal wall surface of the via; and ablating the plating material from the substrate with a force sufficient to embed micrometer-sized particles of the plating material into the internal wall surface of the via in an amount sufficient to form an electrically conductive interconnection between the layers.

2. The method of claim 1 in which the substrate comprises part of the device.

3. The method of claim 1 in which the substrate is separate from the device.

4. The method of claim 1 in which the via has a diameter greater than that of the spot area.

5. The method of claim 1 in which the via has a diameter smaller than about 250 μm.

6. The method of claim 1 further comprising:

directing the laser output in the form of multiple output pulses sequentially at plating material along and within a circumference defined by the internal wall surface of the via to plate the internal wall surface of a cylinder defined by the via.

7. The method of claim 1 in which the internal wall surface comprises at least two layers of different chemical compositions, each layer including one of the following chemical compositions: an organic dielectric material, a reinforcement material, or a metal or combination of metals.

8. The method of claim 7 in which the organic dielectric material is selected from benzocyclobutane, PTFE, polyimides, epoxies, BT, phenolics, cyanate esters, paper, cardboard, or combinations thereof; the reinforcement material is selected from glass, aramid fibers, Kevlar TM, ceramics, or combinations thereof; and the metal is selected from aluminum, copper, gold, molybdenum, nickel, palladium, platinum, silver, titanium, tungsten, or combinations thereof.

9. The method of claim 8 in which the laser output has a spot area and the via has a diameter greater than that of the spot area.

10. The method of claim 1 in which the wavelength of the laser output is within a range of about 180–400 nm.

11. The method of claim 1 in which the laser output comprises several pulses that are employed to plate the internal wall surface.

12. The method of claim 11 in which the laser output pulses are generated at a repetition rate of greater than about 1 kHz.

13. The method of claim 1 in which the laser output is generated by a solid-state laser.

14. The method of claim 12 in which the solid-state laser is selected from the group of Nd:YAG, Nd:YLF, Nd:YAP, and Nd:YVO$_4$.

15. The method of claim 1 in which the internal wall surface has a depth of greater than 25 μm.

16. The method of claim 1 in which the plating material is a metal selected from aluminum, copper, gold, molybdenum, nickel, palladium, platinum, silver, tin, titanium, tungsten, or combinations thereof.

17. The method of claim 1 in which the spot area is less than about 50 μm in diameter.

18. The method of claim 1 in which the device comprises an MCM, BGA, PGA, or a hybrid or semiconductor microcircuit.

19. The method of claim 1 in which the via has a diameter and a depth that is greater than five times the diameter.

20. The method of claim 1 in which the via is formed by a laser prior to plating.

21. The method of claim 20 in which via formation comprises:

generating a first laser output having a first spot area; and applying the first laser output to the device so that the laser output removes at least two layers within the first spot area to form a via having an internal wall surface, an open end, and an opposite end.

22. The method of claim 20 in which via plating is followed by a laser reflow process.

23. The method of claim 1 in which the plating material is a first plating material, further comprising:

subsequently positioning a second plating material in proximity to the internal wall surface of the via;

generating a second laser output;

directing the second laser output through the via toward the second plating material; and ablating the second plating material and depositing it over the first plating material already covering the internal wall surface, such that the second plating material is deposited in an amount sufficient to protect the first plating material from a subsequent processing step.

24. The method of claim 23 in which the first and second plating materials are different materials selected from aluminum, copper, gold, molybdenum, nickel, palladium, platinum, silver, tin, titanium, tungsten, or combinations thereof.

25. The method of claim 1 further comprising:

electrochemically plating the electrically conductive interconnection subsequent to the step of ablating and without an intervening seeding or preplating step.

26. The method of claim 1 in which the via has a depth to diameter aspect ratio greater than 1.

27. The method of claim 1 in which submicrometer-sized particles of the plating material are embedded into the internal wall surface of the via.

28. The method of claim 1 in which the laser output pulses are generated at a repetition rate of greater than about 1 kHz, the via has a diameter greater than that of the spot area, the via diameter is smaller than about 250 μm, the via and a depth to diameter aspect ratio greater than 1, and the internal wall surface has a depth of greater than 25 μm, further comprising:

electrochemically plating the electrically conductive interconnection subsequent to the step of ablating and without an intervening seeding or preplating step.

29. A method for laser processing a multilayered device including at least two layers having different chemical compositions, comprising:

generating a first laser output having a spot area;

applying the first laser output to the device so that the laser output removes at least two layers within the spot area to form a via having an internal wall surface, an open end, and an opposite end;

generating a second laser output;

directing the second laser output through the open end of the via toward a substrate having an electrically conductive material positioned across the opposite end of the via, the first and second laser outputs each including at least one pulse having a wavelength shorter than about 400 nm, a temporal pulse width shorter than about 100 ns, and an average output power of greater than about 100 mW measured over the spot area; and ablating the plating material from the substrate with a force sufficient to embed micrometer-sized particles of the plating material into the internal wall surface of the via in an amount sufficient to form a conductive interconnection between the layers.

30. The method of claim 29 in which the first laser output comprises a series of pulses to form a via having a greater diameter than that of the spot area and the second laser output comprises a series of pulses to plate the via.

31. The method of claim 25 in which the spot area has a maximum lateral dimension of less than about 50 μm.

32. The method of claim 31 in which the internal wall surface comprises at least two layers of different chemical compositions, each layer including at least one of the following chemical compositions: an organic dielectric material, a reinforcement material, or a metal or combination of metals.

33. The method of claim 29 in which the laser output pulses are generated at a repetition rate of greater than about 1 kHz, the via has a diameter greater than that of the spot area, the via diameter is smaller than about 250 μm, the via and a depth to diameter aspect ratio greater than 1, and the internal wall surface has a depth of greater than 25 μm, further comprising:

electrochemically plating the electrically conductive interconnection subsequent to the step of ablating and without an intervening seeding or preplating step.

* * * * *